(12) United States Patent
Sato (10) Patent No.: US 9,541,599 B2
(45) Date of Patent: Jan. 10, 2017

(54) POWER SWITCH WAFER TEST METHOD (75) Inventor: Shigeki Sato, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 386 days.

(21) Appl. No.: 14/009,347

(22) PCT Filed: Feb. 17, 2012

(86) PCT No.: PCT/JP2012/053786
§ 371 (c)(1),
(2), (4) Date: Oct. 23, 2013

(87) PCT Pub. No.: WO2012/137546
PCT Pub. Date: Oct. 11, 2012

(65) Prior Publication Data
US 2014/0035611 A1 Feb. 6, 2014

(30) Foreign Application Priority Data

Apr. 4, 2011 (JP) .................. 2011-082689

(51) Int. Cl.
*G01R 31/26* (2014.01)
*H01L 21/66* (2006.01)

(52) U.S. Cl.
CPC ........... *G01R 31/2608* (2013.01); *H01L 22/14* (2013.01); *H01L 22/34* (2013.01); *H01L 2924/0002* (2013.01)

(58) Field of Classification Search
CPC . G01R 31/2607; G01R 31/2608; G01R 31/26; G01R 31/42; G01R 31/40; H02J 1/10; H02M 7/48; H01L 2924/0002; H01L 2924/00; H01L 22/14; H01L 22/34
(Continued)

(56) References Cited

U.S. PATENT DOCUMENTS 5,530,277 A   6/1996 Otsuki et al.
5,557,128 A   9/1996 Yamazaki et al.
(Continued)

FOREIGN PATENT DOCUMENTS

CN    101010650 A    8/2007
CN    101042421 A    9/2007
(Continued)

OTHER PUBLICATIONS

Chinese Office Action with translation dated Jul. 3, 2015.

*Primary Examiner* — Son Le
(74) *Attorney, Agent, or Firm* — Rabin & Berdo, P.C.

(57) ABSTRACT

A wafer test method of a power switch wherein a main IGBT and a current detecting IGBT that detects a current value of the main IGBT are integrally formed on the same semiconductor substrate is such that there is provided resistance means that causes an emitter current of the current detecting IGBT to flow through an emitter terminal of the main IGBT, the main IGBT and current detecting IGBT are energized simultaneously, thereby applying a constant current to a common collector terminal of the main IGBT and current detecting IGBT, and a current ratio (main current/detected current) between a main current of the main IGBT and a detected current of the current detecting IGBT is calculated from the current flowing through the current detecting IGBT, obtained from the voltage across the resistance means, and the constant current.

6 Claims, 6 Drawing Sheets

(58) Field of Classification Search
USPC .................. 324/765.01, 73.1, 432, 512, 246, 765,324/762.01, 764.01, 762.08
See application file for complete search history.

(56) References Cited

U.S. PATENT DOCUMENTS

| | | |
|---|---|---|
| 2006/0002154 A1 | 1/2006 | Amrani et al. |
| 2007/0205778 A1* | 9/2007 | Fabbro ............... G01R 19/0092 324/713 |
| 2013/0153900 A1* | 6/2013 | Kinouchi et al. ............... 257/48 |

FOREIGN PATENT DOCUMENTS

| | | |
|---|---|---|
| JP | 57-099789 A | 6/1982 |
| JP | H07-161992 A | 6/1995 |
| JP | H07-245394 A | 9/1995 |
| JP | H09-233690 A | 9/1997 |
| JP | 2009-165285 A | 7/2009 |
| WO | WO 2012029652 A1 * | 3/2012 |
| WO | WO-2012029652 A1 | 3/2012 |

* cited by examiner

POWER SWITCH WAFER TEST METHOD

BACKGROUND

Technical Field

The present invention relates to a wafer test method of a power switch integrally formed on a semiconductor substrate.

Background Art

A power switch integrally formed on a semiconductor substrate is used in, for example, an automobile internal combustion engine ignition system. A configuration example of an internal combustion engine ignition system using a power switch is shown in FIG. 4.

Figure 4:
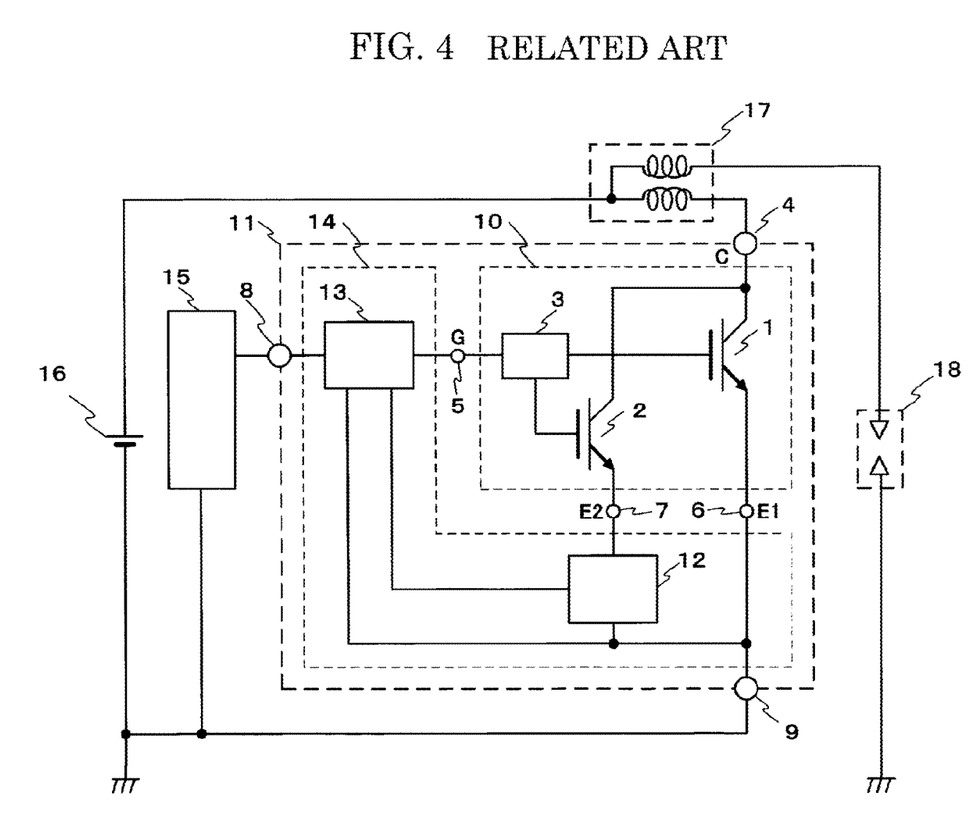
FIG. 4 is a diagram showing a configuration example of an internal combustion engine ignition system using a power switch.

The internal combustion engine ignition system shown in FIG. 4 is configured of a power switch 11, an engine control unit (hereafter called an ECU (Electronic Control Unit)) 15, a battery power supply 16, an ignition coil 17, and a spark plug 18. By on (energizing) and off (cutting off) controlling a primary current flowing through a primary side coil of the ignition coil 17 connected to the battery power supply 16 using the power switch 11, a high voltage is induced in a secondary side coil, and a spark discharge is generated in the spark plug 18. Also, the turning on and off of the power switch 11 is controlled by an on-off signal from the ECU 15.

The power switch 11 shown in FIG. 4 is configured of a power switch unit 10 and a control unit 14, and has a collector terminal (hereafter called a C-terminal) 4 connected to the primary side coil of the ignition coil 17, a gate terminal 8 connected to the ECU 15, and an emitter terminal 9 connected to a ground potential (hereafter called GND). The power switch unit 10 is configured of a main IGBT (Insulated Gate Bipolar Transistor) 1, a current detecting IGBT 2, and a gate resistor circuit 3, while the control unit 14 is configured of a current detector circuit 12 and gate drive circuit 13.

Herein, the power switch 11 shown in FIG. 4 may be of a one-chip configuration wherein the power switch unit 10 and control unit 14 are integrally formed on the same semiconductor substrate, or may be of a two-chip configuration wherein the power switch unit 10 and control unit 14 are each formed on a separate semiconductor substrate.

In the case of a two-chip configuration, connection places forming connection points of the power switch unit 10 and control unit 14, which are a gate terminal (hereafter called a G-terminal) 5, a main IGBT 1 emitter terminal (hereafter called an E1-terminal) 6, and a current detecting IGBT 2 emitter terminal (hereafter called an E2-terminal) 7, are each configured by connecting with connecting means such as wire bonding. Also, in the case of a one-chip configuration, the G-terminal 5, E1-terminal 6, and E2-terminal 7 forming the connection points of the power switch unit 10 and control unit 14 are each used as measurement test terminals at a time of a wafer test.

Also, the power switch 11 shown in FIG. 4 is such that a current limiting function that limits the primary current is provided with an object of preventing burnout of the ignition coil 17 due to a primary current overcurrent, and of securing spark discharge stability when starting-up. The current limiting function is realized by means of detecting the primary current with the current detecting IGBT 2 and current detector circuit 12 and means of controlling the gate voltage of the main IGBT 1 and current detecting IGBT 2 with the gate drive circuit 13 and gate resistor circuit 3 in response to the primary current detection result.

Herein, the primary current flowing through the primary side coil of the ignition coil 17 flows divided into a main current, which flows from the C-terminal 4 of the power switch unit 10 through the main IGBT 1 E1-terminal 6 and the emitter terminal 9, and a detected current, which flows from the C-terminal 4 of the power switch unit 10 through the current detecting IGBT 2 E2-terminal 7, the current detector circuit 12, and the emitter terminal 9. Further, the current ratio (main current flowing through main IGBT 1/detected current flowing through current detecting IGBT 2) thereof is normally set to be 100 or greater.

In the internal combustion engine ignition system, the current ratio (main current/detected current) of the primary current flowing through the power switch unit 10 of the power switch 11 is an important characteristic for the primary current current control function, and is also measured in characteristic tests on the power switch 11. Technology whereby the reference voltage of a current control unit is regulated based on the results of measuring the main current and detected current in order to adjust the current ratio (main current/detected current), which is an important characteristic, to the design value is disclosed in PTL 1 (identified further on).

Next, with regard to a wafer test method for the current ratio (main current/detected current) of the primary current in the power switch 11 shown in FIG. 4, a description will be given, using FIG. 5 and FIG. 6, of a heretofore known general test circuit and test method. Herein, as previously described, the power switch 11 has the power switch unit 10 and control unit 14, and is configured of one chip or two chips, but in the following description of the power switch 11 current ratio (main current/detected current) wafer test method, the power switch 11 is such that the control unit 14 is omitted (the function thereof is irrelevant when measuring the current ratio), and the description will be given with only the power switch unit 10 shown in detail.

Figure 5:
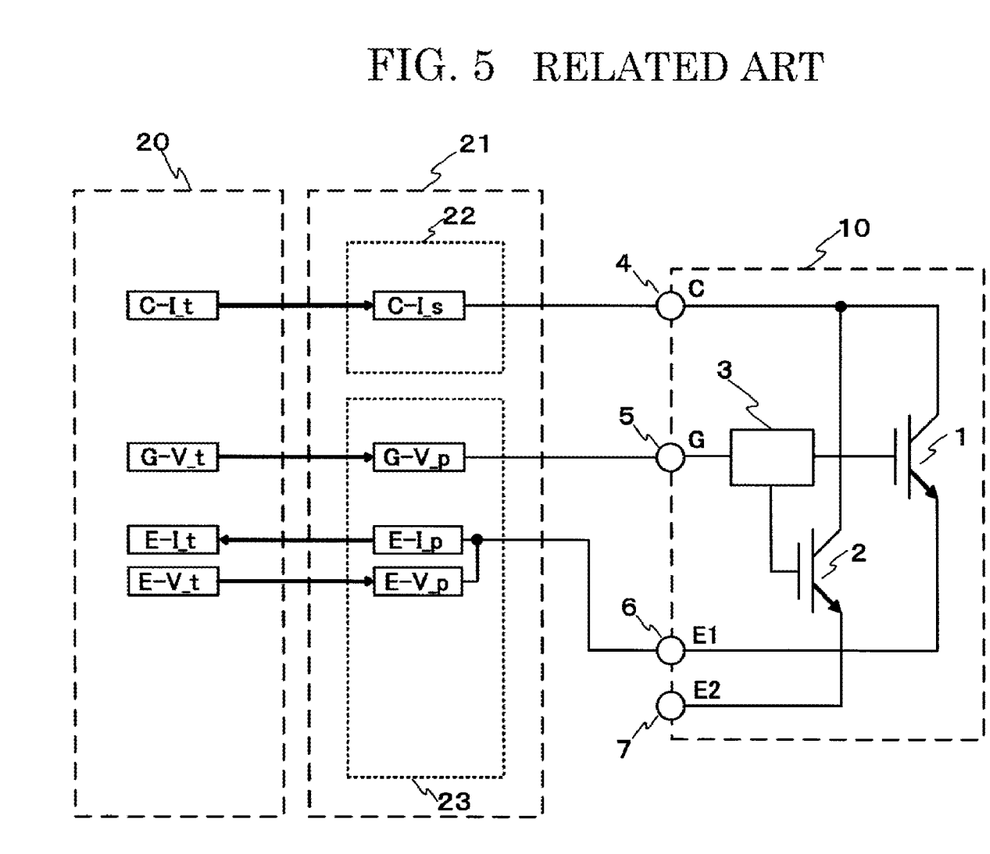
FIG. 5 is a diagram showing a wafer test circuit for measuring a main current in the case of a heretofore known power switch wafer test method.

FIG. 5 is a wafer test circuit for measuring the main current flowing through the main IGBT 1 of the power switch unit 10 in the power switch 11, and is configured of the power switch unit 10, a tester 20, and a tester prober 21. The tester prober 21 has a tester prober stage 22, on which is set a test wafer of the power switch unit 10, and a probe card 23, which connects the measuring terminals of the tester 20 to the terminals of the test wafer of the power switch unit 10.

Next, a description will be given of a method of measuring the main current of the main IGBT 1 using the wafer test circuit shown in FIG. 5. Firstly, an E-V_t terminal of the tester 20 is connected to an E-V_p terminal of the probe card 23, and connected to the E1-terminal (pad) 6 on the power switch unit 10 wafer via a probe connected to the E-V_p terminal of the probe card 23, whereby the E1-terminal 6 is set to a reference potential (normally GND).

Next, a G-V_t terminal of the tester 20 is connected to a G-V_p terminal of the probe card 23, and connected to the G-terminal (pad) 5 on the power switch unit 10 wafer via a probe connected to the G-V_p terminal of the probe card 23, thereby applying a constant voltage Vo (V) at which the main IGBT 1 is turned on. Furthermore, a C-I_t terminal of the tester 20 is connected to the tester prober stage 22 (given C-I_s as a terminal name), and connected to the C-terminal 4 on the back surface of the power switch unit 10 wafer (a wafer back surface electrode corresponds to the C-terminal 4), thereby applying a constant current Io (A) to the main IGBT 1. Further, the current flowing through the E1-terminal 6 is connected via an E-1_p terminal of the probe card 23 to an E-1_t terminal of the tester 20, and a main current Im (A) flowing through the main IGBT 1 is measured.

Figure 6:
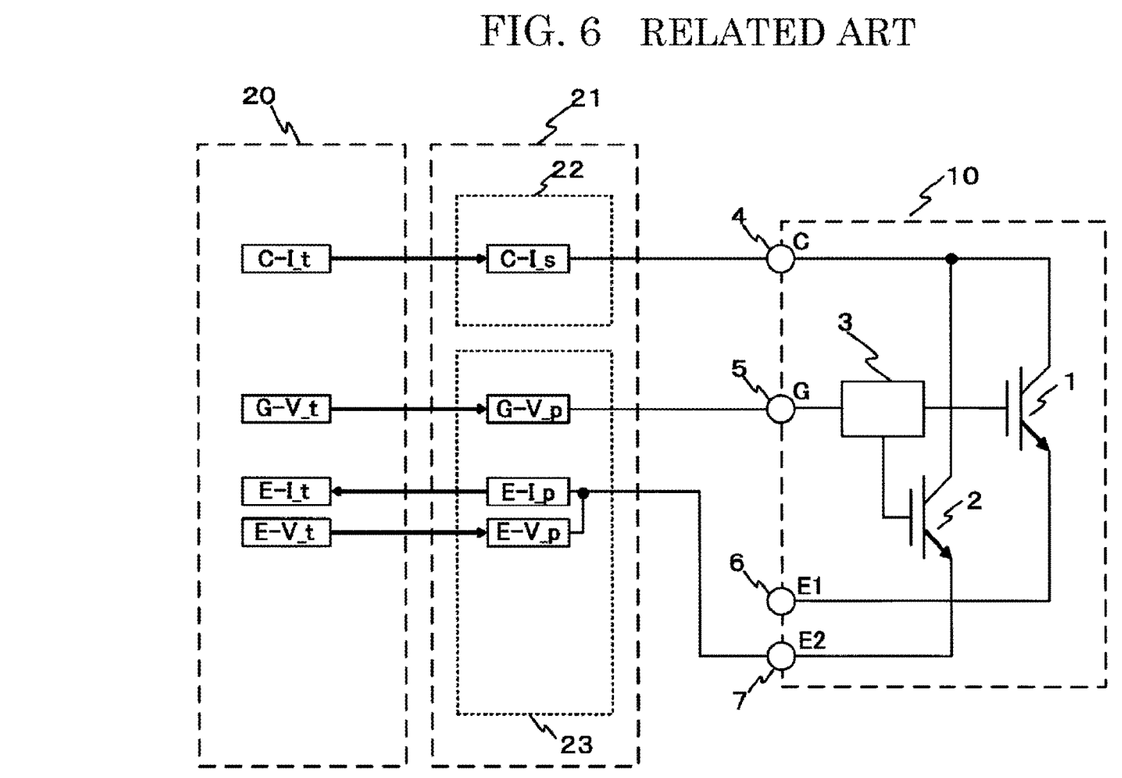
FIG. 6 is a diagram showing a wafer test circuit for measuring a detected current in the case of the heretofore known power switch wafer test method.

FIG. 6 is a wafer test circuit for measuring the detected current flowing through the current detecting IGBT 2 of the power switch unit 10 in the power switch 11 and, in the same way as in FIG. 5, is configured of the power switch unit 10, tester 20, and tester prober 21. The tester prober 21 has the tester prober stage 22, on which is set a test wafer of the power switch unit 10, and the probe card 23, which connects the measuring terminals of the tester 20 to the terminals of the test wafer of the power switch unit 10.

Next, a description will be given of a method of measuring the detected current of the current detecting IGBT 2 using the wafer test circuit shown in FIG. 6. Firstly, the E-V_t terminal of the tester 20 is connected to the E-V_p terminal of the probe card 23, and connected to the E2-terminal (pad) 7 on the power switch unit 10 wafer via the probe connected to the E-V_p terminal of the probe card 23, whereby the E2-terminal 7 is set to a reference potential (normally GND). Next, the G-V_t terminal of the tester 20 is connected to the G-V_p terminal of the probe card 23, and connected to the G-terminal (pad) 5 on the power switch unit 10 wafer via the probe connected to the G-V_p terminal of the probe card 23, thereby applying the constant voltage Vo (V) at which the current detecting IGBT 2 is turned on. Furthermore, the C-I_t terminal of the tester 20 is connected via the tester prober stage 22 (given C-I_s as a terminal name) to the C-terminal 4 on the back surface of the power switch unit 10 wafer (the wafer back surface electrode corresponds to the C-terminal 4), thereby applying the constant current Io (A) to the current detecting IGBT 2. Further, the current flowing through the E2-terminal 7 is connected via the E-1_p terminal of the probe card 23 to the E-1_t terminal of the tester 20, and a detected current Is (A) flowing through the current detecting IGBT 2 is measured.

Then, the current ratio (main current/detected current) of the power switch unit 10 in the power switch 11 is obtained by calculating main current Im (A)/detected current Is (A) from the main current Im (A) flowing through the main IGBT 1 measured using the wafer test circuit of FIG. 5 and the detected current Is (A) flowing through the current detecting IGBT 2 measured using the wafer test circuit of FIG. 6.

CITATION LIST

Patent Literature

PTL 1: JP-A-9-233690

Technical Problem

The wafer test method for the current ratio (main current/detected current) of the primary current in the power switch 11 described in FIG. 5 and FIG. 6 is such that the main current flowing through the main IGBT 1 and the detected current flowing through the current detecting IGBT 2 are measured separately, because of which the current ratio (main current/detected current) is determined by the ratio of the layout area on the semiconductor substrate. However, when the power switch 11 is in an actual operating condition, the main IGBT 1 and current detecting IGBT 2 are turned on and off simultaneously, because of which, inner electron conditions differ due to the positional relationship (distance) between the layout dispositions of the main IGBT 1 and current detecting IGBT 2 on the semiconductor substrate, and it is thus not possible to accurately measure the current ratio (main current/detected current) using the heretofore known wafer test method whereby the main current of the main IGBT 1 and the detected current of the current detecting IGBT 2 are measured separately.

Also, a sense resistor Rsns (which detects current by converting the current into voltage) for detecting the detected current flowing through the current detecting IGBT 2 is built into the current detector circuit 12 of the power switch 11 shown in FIG. 4. Because of this, when the power switch 11 is in an actual working condition, a voltage difference equivalent to the voltage generated in the sense resistor Rsns occurs between the voltage between the G-terminal 5 and the E1-terminal 6 and E2-terminal 7 of the main IGBT 1 and current detecting IGBT 2 of the power switch unit 10 and the voltage between the C-terminal 4 and the E1-terminal 6 and E2-terminal 7. However, as this voltage difference is not taken into consideration with the heretofore known wafer test method described in FIG. 5 and FIG. 6, it is not possible to accurately measure the current ratio (main current/detected current).

Also, in order to realize a wafer test that takes into consideration the voltage difference caused by the sense resistor Rsns, a dedicated tester with a breakdown voltage of several hundred volts including multiple power supplies and multiple channels is needed, which results in an increase in the cost of the wafer testing process.

SUMMARY

The invention, having been contrived bearing in mind the heretofore described problems, has an object of providing a power switch wafer test method whereby it is possible, in a power switch wherein a main IGBT and a current detecting IGBT, whose collector terminal and gate terminal are connected respectively to the collector terminal and gate terminal of the main IGBT and which detects the current value of the main IGBT, are integrally formed on the same semiconductor substrate, to test the current ratio (main current/detected current) between a main current flowing through the main IGBT and a detected current flowing through the current detecting IGBT, in the same way as in an actual operating condition, using a simple method.

In order to solve the heretofore described problems, a power switch wafer test method of the invention is such that a resistor is connected between a main IGBT emitter terminal pin and a current detecting IGBT emitter terminal pin of a probe card used in a wafer test, a voltage difference is provided between a main IGBT emitter terminal and a current detecting IGBT emitter terminal, and a wafer test is carried out in a condition wherein the main IGBT and current detecting IGBT are turned on simultaneously, whereby a current ratio (main current/detected current) the same as in an actual operating condition is obtained.

That is, the power switch wafer test method of the invention is a wafer test method of a power switch having a main IGBT and a current detecting IGBT, of which a collector terminal and gate terminal are connected respectively to a collector terminal and gate terminal of the main IGBT and which detects a current value of the main IGBT, wherein the main IGBT and current detecting IGBT are integrally formed on the same semiconductor substrate, and is characterized in that there is provided resistance means that causes an emitter current of the current detecting IGBT to flow through an emitter terminal of the main IGBT, the main IGBT and current detecting IGBT are energized simultaneously, thereby applying a constant current to a common collector terminal of the main IGBT and current detecting IGBT, and a current ratio (main current/detected current) between a main current of the main IGBT and a detected current of the current detecting IGBT is calculated from the current flowing through the current detecting IGBT, obtained from the voltage across the resistance means, and the constant current.

Also, the power switch wafer test method of the invention is a wafer test method of a power switch having a main IGBT and a current detecting IGBT, of which a collector terminal and gate terminal are connected respectively to a collector terminal and gate terminal of the main IGBT and which detects a current value of the main IGBT, wherein the main IGBT and current detecting IGBT are integrally formed on the same semiconductor substrate, and is characterized in that there is provided resistance means that causes an emitter current of the current detecting IGBT to flow through an emitter terminal of the main IGBT, the main IGBT and current detecting IGBT are energized simultaneously, a total current of a main current of the main IGBT flowing from the emitter terminal of the main IGBT and a detected current of the current detecting IGBT is detected, the detected current of the current detecting IGBT is detected from the voltage across the resistance means, and a current ratio (main current/detected current) between the main current of the main IGBT and the detected current of the current detecting IGBT is calculated.

Also, the resistance means of the power switch wafer test method of the invention is characterized by being connected between terminals of a wafer test probe card corresponding to the emitter terminal of the main IGBT and the emitter terminal of the current detecting IGBT.

Advantageous Effects of Invention

The power switch wafer test method of the invention is such that, by a resistor being connected between a main IGBT emitter terminal pin and a current detecting IGBT emitter terminal pin of a wafer measuring probe card, a voltage difference being provided between a main IGBT emitter terminal and a current detecting IGBT emitter terminal, and a wafer test being carried out in a condition wherein the main IGBT and current detecting IGBT are turned on simultaneously, it is possible to easily measure a current ratio (main current/detected current) in a condition the same as an actual operation.

The heretofore described and other objects, characteristics, and advantages of the invention will be made clear by the following description relating to the attached drawings representing an embodiment preferred as an example of the invention.

DETAILED DESCRIPTION

Hereafter, a description will be given, while referring to the drawings, of a power switch wafer testing method according to an embodiment of the invention.

EXAMPLE 1

A power switch according to the invention is used in, for example, an internal combustion engine ignition system. As a configuration example of this internal combustion engine ignition system is the same configuration as that in the previously described FIG. 4, a detailed description will be omitted.

Also, the configuration of the power switch according to the invention is also the same configuration as that in the previously described FIG. 4. That is, the power switch 11 is configured of a power switch unit 10 including a main IGBT 1, a current detecting IGBT 2, and a gate resistor circuit 3, and a control unit 14 including a current detector circuit 12 and gate drive circuit 13. Further, the power switch 11 has a C-terminal 4 connected to a primary side coil of an ignition coil 17, a gate terminal 8 connected to an ECU 15, and an emitter terminal 9 connected to GND.

Also, the power switch 11, in the same way as in the previously described FIG. 4, may be of a one-chip configuration wherein the power switch unit 10 and control unit 14 are integrally formed on the same semiconductor substrate, or may be of a two-chip configuration wherein the power switch unit and control unit 14 are each formed on a separate semiconductor substrate. A G-terminal 5, E1-terminal 6, and E2-terminal 7, which are connection places in which the power switch unit 10 and control unit 14 are connected, are each connected by connecting means such as wire bonding in the case of a two-chip configuration, and are used as measurement test terminals at a time of a wafer test in the case of a one-chip configuration.

Figure 1:
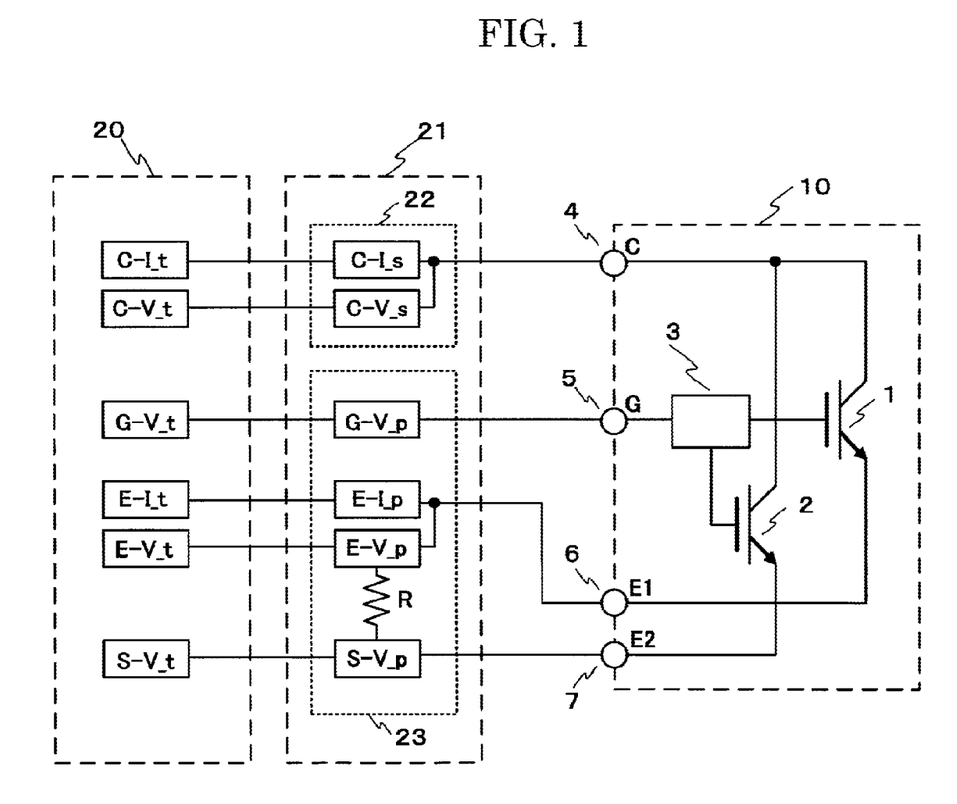
FIG. 1 is a diagram showing a configuration example of a wafer test circuit used for a power switch current ratio wafer test method according to the invention.

FIG. 1 is a configuration example of a wafer test circuit used for a current ratio (main current flowing through main IGBT 1/detected current flowing through current detecting IGBT 2) wafer test method of the power switch 11 according to the invention. The power switch 11 is such that, as previously described, the power switch unit 10 and control unit 14 are configured on one chip or two chips, but in the configuration example shown in FIG. 1, the power switch 11 is such that the control unit 14 is omitted (the function thereof is irrelevant when measuring the current ratio), and only the power switch unit 10 is shown in detail. Also, the same reference signs are given to regions the same as in FIG. 5 and FIG. 6, described with regard to a heretofore known power switch wafer test method, and a detailed description will be omitted.

FIG. 1 is a wafer test circuit for measuring the current ratio (main current/detected current) of the power switch 11, and is configured of the power switch unit 10, a tester 20, and a tester prober 21. The tester prober 21 includes a tester prober stage 22, on which is set a test wafer of the power switch unit 10, and a probe card 23, which connects the measuring terminals of the tester 20 to the terminals of the test wafer of the power switch unit 10, and a resistor R is disposed on the probe card 23.

Herein, the tester 20 includes terminals C-I_t, C-V_t, G-V_t, E-I_t, E-V_t, S-V_t, which apply or measure current or voltage. Also, the probe card 23 includes terminals G-V_p, E-I_p, E-V_p, and S-V_p, which correspond to terminals of the tester 20. The terminals of the probe card 23 each have a probe, and are connected to the G-terminal 5, E1-terminal 6, and E2-terminal 7, which form pads on the power switch unit 10 wafer. Further, the resistor R is connected between the E-V_p terminal and S-V_p terminal on the probe card 23. A difference in voltage is set between the E1-terminal 6 of the main IGBT 1 and the E2-terminal 7 of the current detecting IGBT 2 by the resistor R. In the tester prober stage 22, reference signs of a C-I_s terminal and C-V_s terminal are given to correspond to the C-I_t terminal and C-V_t terminal of the tester 20, and the C-I_s terminal and C-V_s terminal are connected to the C-terminal 4 on the back surface of the power switch unit 10 wafer (a wafer back surface electrode corresponds to the C-terminal 4).

Figure 2:
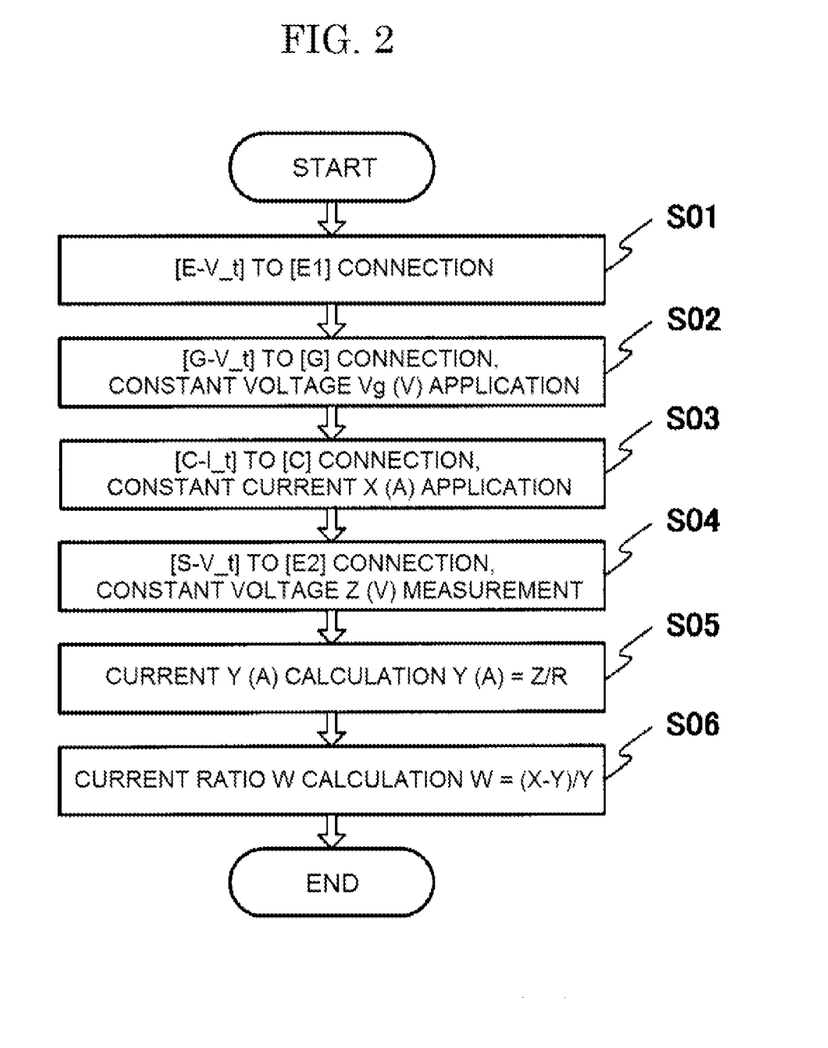
FIG. 2 is a test flow diagram showing the procedure of a first wafer test method relating to the power switch wafer test method according to the invention.

Next, using the wafer test circuit shown in FIG. 1, a description will be given of a method of wafer testing the current ratio (main current/detected current) of the power switch 11. FIG. 2 is a test flow diagram showing the procedure of a first wafer test method relating to a wafer test method of the power switch 11 according to the invention.

The test flow of FIG. 2 is such that firstly, in step S01, the E-V_t terminal of the tester 20 is connected to the E-V_p terminal of the probe card 23, and connected to the E1-terminal (pad) 6 on the power switch unit 10 wafer via the probe connected to the E-V_p terminal of the probe card 23, whereby the E1-terminal 6 is set to a reference potential.

Next, in step S02, the G-V_t terminal of the tester 20 is connected to the G-V_p terminal of the probe card 23, and connected to the G-terminal (pad) 5 on the power switch unit 10 wafer via the probe connected to the G-V_p terminal of the probe card 23, thereby applying a constant voltage Vg (V) at which the main IGBT 1 and current detecting IGBT 2 are simultaneously turned on.

Next, in step S03, the C-I_t terminal of the tester 20 is connected to the C-terminal 4 on the back surface of the power switch unit 10 wafer via the tester prober stage 22 (the reference sign of the C-I_s terminal), thereby applying a constant current X (A) to the main IGBT 1 and current detecting IGBT 2.

Next, in step S04, the S-V_t terminal of the tester 20 is connected to the S-V_p terminal of the probe card 23, and connected to the E2-terminal (pad) 7 on the power switch unit 10 wafer via the probe connected to the S-V_p terminal of the probe card 23, whereby a voltage Z (V) of the E2-terminal 7 of the current detecting IGBT 2 is measured. The voltage Z (V) is a voltage generated by the constant current X (A) applied to the C-terminal 4 being divided into a main current flowing through the main IGBT 1 and a detected current flowing through the current detecting IGBT 2, and the detected current flowing through the resistor R. That is, the voltage Z (V) corresponds to a voltage difference deriving from the constant current X (A) applied to the C-terminal 4 and generated by the resistor R between the E1-terminal 6 of the main IGBT 1 and E2-terminal of the current detecting IGBT 2.

Next, in step S05, a detected current Y (A) flowing through the current detecting IGBT 2 is calculated from the voltage Z (V), which is the voltage difference occurring across the resistor R, using the mathematical formula Y (A)=Z (V)/R (Ω) (the resistor name and resistance value are the same).

Then, in step S06, the main current of the IGBT 1 is obtained from the constant current X (A) applied to the C-terminal 4 and the calculated detected current Y (A) of the current detecting IGBT 2, and a current ratio W (main current/detected current) is calculated using the mathematical formula W=(X(A)−Y(A))/Y(A).

As heretofore described, the wafer test method of the power switch 11 according to the invention is a wafer test method of a power switch such that the main IGBT 1 and current detecting IGBT 2 are integrally formed on the same semiconductor substrate and, by the resistor R being connected between the wafer measuring probe card E-V_p terminal and S-V_p terminal corresponding to the E1-terminal 6 of the main IGBT 1 and the E2-terminal 7 of the current detecting IGBT 2, a voltage difference being set between the E1-terminal 6 of the main IGBT 1 and the E2-terminal 7 of the current detecting IGBT 2 by the resistor 6, and the wafer test being carried out in a condition wherein the main IGBT 1 and current detecting IGBT 2 are simultaneously turned on, it is possible to easily and accurately measure the current ratio (main current flowing through main IGBT 1/detected current flowing through current detecting IGBT 2) of a primary current in a condition the same as that of an actual operation.

EXAMPLE 2

Figure 3:
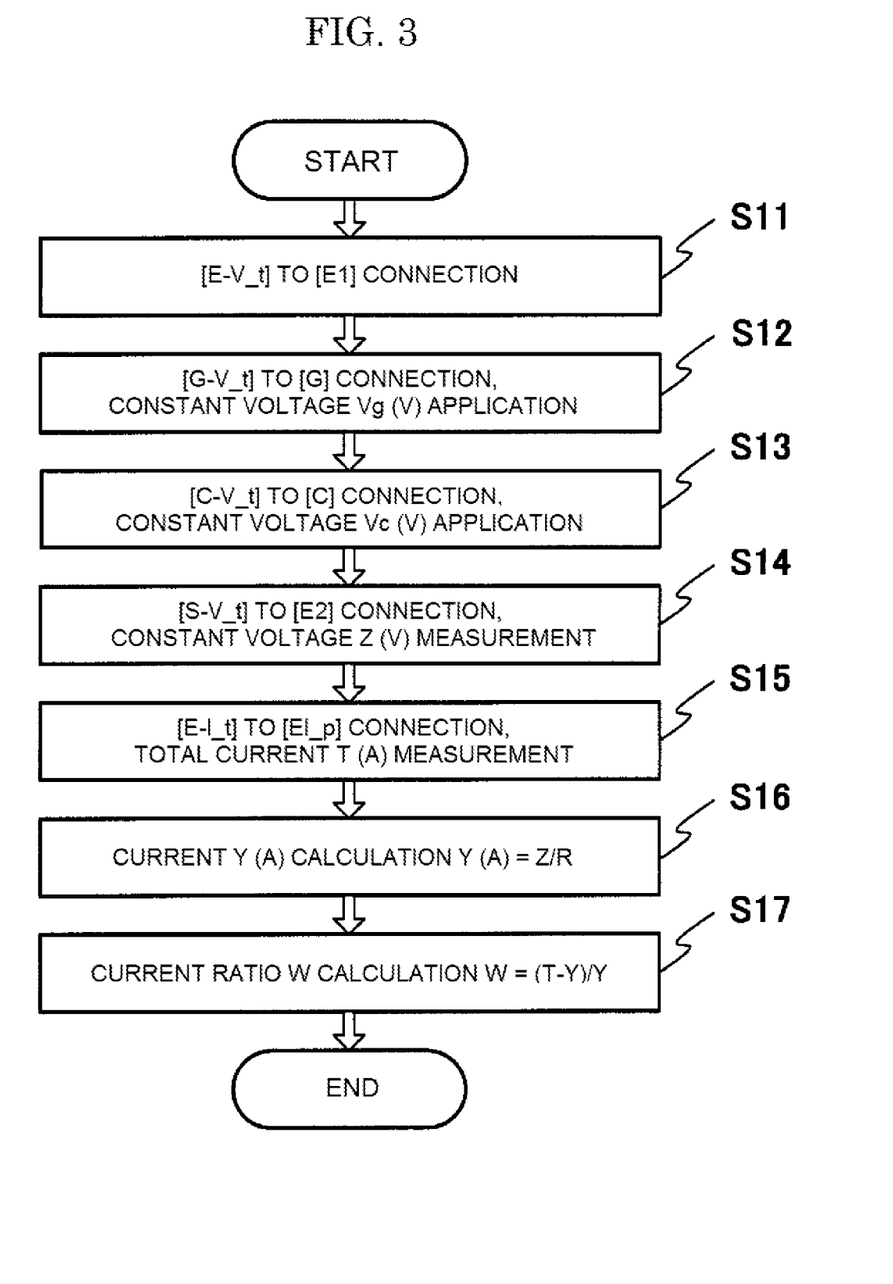
FIG. 3 is a test flow diagram showing the procedure of a second wafer test method relating to the power switch wafer test method according to the invention.

Next, using the wafer test circuit shown in FIG. 1, a description will be given of another method of wafer testing the current ratio (main current/detected current) of the power switch 11. FIG. 3 is a test flow diagram showing the procedure of a second wafer test method relating to a wafer test method of the power switch 11 according to the invention.

The test flow of FIG. 3 is such that firstly, in step S11, the E-V_t terminal of the tester 20 is connected to the E-V_p terminal of the probe card 23, and connected to the E1-terminal (pad) 6 on the power switch unit 10 wafer via the probe connected to the E-V_p terminal of the probe card 23, whereby the E1-terminal 6 is set to a reference potential.

Next, in step S12, the G-V_t terminal of the tester 20 is connected to the G-V_p terminal of the probe card 23, and connected to the G-terminal (pad) 5 on the power switch unit 10 wafer via the probe connected to the G-V_p terminal of the probe card 23, thereby applying the constant voltage Vg (V) at which the main IGBT 1 and current detecting IGBT 2 are simultaneously turned on.

Next, in step S13, the C-V_t terminal of the tester 20 is connected to the C-terminal 4 on the back surface of the power switch unit 10 wafer via the tester prober stage 22 (the reference sign of the C-V_s terminal), thereby applying a constant voltage Vc (V) to the main IGBT 1 and current detecting IGBT 2.

Next, in step S14, the S-V_t terminal of the tester 20 is connected to the S-V_p terminal of the probe card 23, and connected to the E2-terminal (pad) 7 on the power switch unit 10 wafer via the probe connected to the S-V_p terminal of the probe card 23, whereby the voltage Z (V) of the E2-terminal 7 of the current detecting IGBT 2 is measured. The voltage Z (V) is a voltage generated by a main current flowing through the main IGBT 1 and a detected current flowing through the current detecting IGBT 2 owing to the constant voltage Vc (V) applied to the C-terminal 4, and the detected current flowing through the resistor R. That is, the voltage Z (V) corresponds to a voltage difference deriving from the constant voltage Vc (V) applied to the C-terminal 4 and generated by the resistor R between the E1-terminal 6 of the main IGBT 1 and E2-terminal 7 of the current detecting IGBT 2.

Next, in step S15, the E-I_t terminal of the tester 20 is connected to the E-I_p terminal of the probe card 23, and a total current T (A) is measured by adding together the main current flowing through the main IGBT 1 and detected current flowing through the current detecting IGBT 2 owing to the constant voltage Vc (V) applied to the C-terminal 4.

Next, in step S16, the detected current Y (A) flowing through the current detecting IGBT 2 is calculated from the voltage Z (V), which is the voltage difference occurring across the resistor R, using the mathematical formula Y (A)=Z (V)/R (Ω) (the resistor name and resistance value are the same)

Then, in step S17, the main current of the IGBT 1 is obtained from the total current T (A) and the calculated detected current Y (A) of the current detecting IGBT 2, and the current ratio W (main current/detected current) is calculated using the mathematical formula W=(T(A)−Y(A))/Y (A).

As heretofore described, the wafer test method of the power switch 11 according to the invention is a wafer test method of a power switch such that the main IGBT 1 and current detecting IGBT 2 are integrally formed on the same semiconductor substrate and, by the resistor R being connected between the wafer measuring probe card E-V_p terminal and S-V_p terminal corresponding to the E1-terminal 6 of the main IGBT 1 and the E2-terminal 7 of the current detecting IGBT 2, a voltage difference being set between the E1-terminal 6 of the main IGBT 1 and the E2-terminal 7 of the current detecting IGBT 2 by the resistor R, and the wafer test being carried out in a condition wherein the main IGBT 1 and current detecting IGBT 2 are simultaneously turned on, it is possible to easily and accurately measure the current ratio (main current flowing through main IGBT 1/detected current flowing through current detecting IGBT 2) of a primary current in a condition the same as that of an actual operation.

According to the inventor's test measurement results, the current ratio (main current/detected current) of the primary current in the power switch wafer test according to the invention is such that, although a discrepancy of approximately five times occurs with respect to the measurement values of a product assembled in a package using the heretofore known wafer test method shown in FIG. 5 and FIG. 6, results the same as the measurement values of a product assembled in a package are obtained using the wafer test method according to the invention shown in FIG. 1.

Heretofore, a description has been given of an embodiment of the invention but, the invention not being limited to the embodiment, various improvements and changes are possible without departing from the scope of the invention.

The above indicates merely the principle of the invention. Furthermore, a large number of modifications and changes being possible to those skilled in the art, the invention is not limited to the exact configurations and application examples shown and described above, and all corresponding modification examples and equivalents are seen as being the scope of the invention according to the attached claims and equivalents thereof.

LIST OF REFERENCE SIGNS

1 Main IGBT
2 Current detecting IGBT
3 Gate resistor circuit
4 Collector terminal (C-terminal)
5 Gate terminal (G-terminal)
6 Main IGBT 1 emitter terminal (E1 terminal)
7 Current detecting IGBT 2 emitter terminal (E2 terminal)
8 Gate terminal
9 Emitter terminal (GND terminal)
10 Power switch unit
11 Power switch
12 Current detector circuit
13 Gate drive circuit
14 Control unit
15 Engine control unit (ECU)
16 Battery power supply
17 Ignition coil
18 Spark plug
20 Tester
21 Tester prober
22 Tester prober stage
23 Probe card
R Resistor and resistance value

The invention claimed is:

1. A power switch wafer test method, being a wafer test method of a power switch having a main IGBT (Insulated Gate Bipolar Transistor) and a current detecting IGBT, of which a collector terminal and gate terminal are connected respectively to a collector terminal and gate terminal of the main IGBT and which detects a current value of the main IGBT, wherein the main IGBT and current detecting IGBT are integrally formed on a same semiconductor substrate, the power switch wafer test method comprising:

providing resistance means that causes an emitter current of the current detecting IGBT to flow through an emitter terminal of the main IGBT, energizing the main IGBT and current detecting IGBT simultaneously, thereby applying a constant current to a common collector terminal of the main IGBT and current detecting IGBT, and calculating a current ratio between a main current of the main IGBT and a detected current of the current detecting IGBT from the current flowing through the current detecting IGBT, obtained from the voltage across the resistance means, and the constant current;

wherein the resistance means is connected between a main IGBT test terminal and a current detecting IGBT test terminal of a wafer test probe card, the main IGBT test terminal and the current detecting IGBT test terminal corresponding to the emitter terminal of the main IGBT and an emitter terminal of the current detecting IGBT.

2. A power switch wafer test method, being a wafer test method of a power switch having a main IGBT and a current detecting IGBT, of which a collector terminal and gate terminal are connected respectively to a collector terminal and gate terminal of the main IGBT and which detects a current value of the main IGBT, wherein the main IGBT and current detecting IGBT are integrally formed on a same semiconductor substrate, the power switch wafer test method comprising:

providing resistance means that causes an emitter current of the current detecting IGBT to flow through an emitter terminal of the main IGBT, energizing the main IGBT and current detecting IGBT simultaneously, detecting a total current of a main current of the main IGBT flowing from the emitter terminal of the main IGBT and a detected current of the current detecting IGBT, the detected current of the current detecting IGBT being detected from a voltage across the resistance means, and calculating a current ratio between the main current of the main IGBT and the detected current of the current detecting IGBT;

wherein the resistance means is connected between a main IGBT test terminal and a current detecting IGBT test terminal of a wafer test probe card, the main IGBT test terminal and the current detecting IGBT test terminal corresponding to the emitter terminal of the main IGBT and an emitter terminal of the current detecting IGBT.

3. A method, comprising:

using a testing device, applying a constant current to a common collector terminal of a main IGBT and a current-detecting IGBT;

generating a voltage across a resistance provided in the testing device based on the constant current;

determining a current flowing through the current-detecting IGBT based on the voltage and the resistance; and calculating a ratio of a main current of the main IGBT to a detected current of the current-detecting IGBT based on the constant current and the current determined to be flowing through the current-detecting IGBT;

wherein the applying the constant current comprises using the testing device to energize the main IGBT and the current-detecting IGBT substantially simultaneously; and wherein the resistance is connected between a main IGBT test terminal and a current detecting IGBT test terminal of the testing device, the main IGBT test terminal and the current detecting IGBT test terminal corresponding to an emitter terminal of the main IGBT and an emitter terminal of the current-detecting IGBT.

4. The method of claim 3, comprising generating the voltage across the resistance by dividing the constant current applied to the common collector terminal of the main IGBT and the current-detecting IGBT into a current flowing through the main IGBT and a current flowing through the resistance.

5. The method of claim 4, wherein the calculating the ratio comprises determining a difference between the constant current and the current determined to be flowing through the current-detecting IGBT.

6. The method of claim 5, wherein the calculating the ratio further comprises determining a value of the difference relative to the current determined to be flowing through the current-detecting IGBT.

* * * * *